US011282908B2

United States Patent
Wang et al.

(10) Patent No.: US 11,282,908 B2
(45) Date of Patent: Mar. 22, 2022

(54) CONTROL METHODS AND CONTROL DEVICES FOR DISPLAY POWER SUPPLY

(71) Applicant: Kunshan Go-Visionox Opto-Electronics Co., Ltd., Kunshan (CN)

(72) Inventors: Yuqing Wang, Kunshan (CN); Zheng Wang, Kunshan (CN); Xiaobao Zhang, Kunshan (CN); Mingwei Ge, Kunshan (CN)

(73) Assignee: Kunshan Go-Visionox Opto-Electronics Co., Ltd., Kunshan (CN)

( * ) Notice: Subject to any disclaimer, the term of this patent is extended or adjusted under 35 U.S.C. 154(b) by 76 days.

(21) Appl. No.: 16/328,287

(22) PCT Filed: May 24, 2018

(86) PCT No.: PCT/CN2018/088248
§ 371 (c)(1),
(2) Date: Feb. 26, 2019

(87) PCT Pub. No.: WO2019/011064
PCT Pub. Date: Jan. 17, 2019

(65) Prior Publication Data
US 2021/0280651 A1    Sep. 9, 2021

(30) Foreign Application Priority Data
Jul. 13, 2017 (CN) .......................... 201710571690.X

(51) Int. Cl.
*H01L 27/32* (2006.01)
*G09G 3/3258* (2016.01)
*G09G 3/36* (2006.01)

(52) U.S. Cl.
CPC ....... *H01L 27/3262* (2013.01); *G09G 3/3258* (2013.01); *G09G 3/3696* (2013.01); *G09G 2330/028* (2013.01)

(58) Field of Classification Search
CPC ............... G09G 3/2011; G09G 3/3659; G09G 2300/0857; G09G 2330/021;
(Continued)

(56) References Cited

U.S. PATENT DOCUMENTS 5,777,611 A    7/1998 Song
5,841,431 A    11/1998 Simmers
(Continued)

FOREIGN PATENT DOCUMENTS

CN    1246194 A    3/2000
CN    101373288 A    2/2009
(Continued)

OTHER PUBLICATIONS

Office Action of EP Application No. 18832593.0 dated Jul. 27, 2020.
(Continued)

*Primary Examiner* — Shaheda A Abdin
(74) *Attorney, Agent, or Firm* — Kilpatrick Townsend & Stockton

(57) ABSTRACT

A control method and a control device of display power supply, and an electronic device, applied to a TFT (thin film transistor) display screen. The TFT display screen includes a drive IC and a screen body; the drive IC is configured to control the screen body to display a corresponding image, and the screen body controls a pixel via a thin film transistor; the control method includes: controlling a power supply of the drive IC to power up according to a set rule after receiving a start signal for reducing a probability of abnor-
(Continued)

mality in a voltage outputted by the drive IC; and supplying power continuously and normally to the drive IC.

16 Claims, 4 Drawing Sheets

(58) Field of Classification Search
CPC ... G09G 2300/0809; G09G 2300/0842; G09G 2330/02; G09G 2310/0251
See application file for complete search history.

(56) References Cited

U.S. PATENT DOCUMENTS

| | | | |
|---|---|---|---|
| 6,373,479 B1 | 4/2002 | Moon | |
| 2002/0154107 A1* | 10/2002 | Senda | G09G 3/2011 345/204 |
| 2003/0020676 A1 | 1/2003 | Lin et al. | |
| 2006/0132419 A1* | 6/2006 | Morita | G09G 3/3648 345/98 |
| 2007/0146949 A1 | 6/2007 | Nishimura | |
| 2008/0094386 A1 | 4/2008 | Park et al. | |
| 2009/0051663 A1 | 2/2009 | Linssen | |
| 2012/0068991 A1 | 3/2012 | Watsuda | |
| 2012/0105411 A1 | 5/2012 | Li et al. | |
| 2016/0240130 A1* | 8/2016 | Nishimura | G09G 3/006 |
| 2018/0096656 A1 | 4/2018 | Lee et al. | |

FOREIGN PATENT DOCUMENTS

| | | | |
|---|---|---|---|
| CN | 102131328 | A | 7/2011 |
| CN | 201995164 | U | 9/2011 |
| CN | 202110793 | U | 1/2012 |
| CN | 103927957 | A | 7/2014 |
| CN | 104538003 | A | 4/2015 |
| CN | 105118460 | A | 12/2015 |
| CN | 106847215 | A | 6/2017 |
| GB | 2300958 | A | 11/1996 |
| GB | 2300958 | B | 2/1999 |
| JP | 2000122028 | A | 4/2000 |
| JP | 2005062618 | A | 3/2005 |
| JP | 2005091636 | A | 4/2005 |
| JP | 2009271392 | A | 11/2009 |
| KR | 100147491 | B1 | 12/1998 |
| KR | 10-0304264 | B | 12/2001 |
| TW | 407256 | B | 10/2000 |
| TW | 519610 | B | 2/2003 |
| TW | 201133442 | A | 10/2011 |
| TW | 201218155 | A | 5/2012 |

OTHER PUBLICATIONS

Office Action of JP Application No. 2019-537080 dated Aug. 21, 2020.
Office Action of KR Application No. 10-2019-7020759 dated Aug. 24, 2020.
Office Action of CN Application No. 201710571690.X dated Apr. 22, 2020.
Extended European Report dated Oct. 29, 2019 in the corresponding EP application (application No. 18832593.0).
International Search Report dated Aug. 29, 2018 in the corresponding PCT application (application No. PCT/CN2018/088248).
TW First Office Action dated Dec. 17, 2018 in the corresponding TW application (application No. 107120703).
CN First Office Action dated Jan. 3, 2020 in the corresponding CN application (applicaiton No. 201710571690.X).
Japanese Office Action dated Oct. 3, 2021 in corresponding JP Application No. 2019-537080.
Grant of Patent dated Feb. 25, 2021 in corresponding KR Application No. 10-2019-7020759.

* cited by examiner

CONTROL METHODS AND CONTROL DEVICES FOR DISPLAY POWER SUPPLY

CROSS-REFERENCE TO RELATED APPLICATIONS

This application is a U.S. national Stage of International Application No. PCT/CN2018/088248, filed on May 24, 2018, designating the United States, which claims priority to Chinese Patent Application No. 201710571690.X, filed with the Chinese Patent Office on Jul. 13, 2017 and entitled "CONTROL METHOD AND CONTROL DEVICE OF DISPLAY POWER SUPPLY, STORAGE MEDIUM AND ELECTRONIC APPARATUS", the content of each of which is hereby incorporated by reference in its entirety.

FIELD

The present disclosure relates to the technical field of display, and in particular, relates to control methods and control devices for display power supply.

BACKGROUND

A thin film transistor (TFT) type display screen is a mainstream display device on various types of notebook computers and desktops, each pixel point on this type of display is driven by a TFT integrated behind the pixel point. A TFT display screen generally includes a drive IC and a screen body. The drive IC is configured to control the operation state of the TFT, thereby causing the screen body to display a corresponding image. The conventional TFT display screen will demonstrate a black screen phenomenon when restarting or waking up in sleep, and the operation performance of the drive IC directly affects the display effect of the screen body, as such, it is an urgent problem to be solved as on how to improve the performance of the drive IC.

SUMMARY

Accordingly, it is necessary to provide a control method and a control device of display power supply, a storage medium and an electronic device in view of the problem on how to improve the performance of the TFT display screen drive IC.

A control method of display power supply, applied to a thin film transistor display screen including a drive IC and a screen body, the drive IC controlling the screen body to display a corresponding image, and the screen body controlling a pixel via a thin film transistor;

the control method includes:

controlling a power supply of the drive IC to power up according to a set rule after receiving a start signal for reducing a probability of abnormality in a voltage outputted by the drive IC; and supplying power continuously and normally to the drive IC.

In one of the embodiments, the drive IC includes a power management circuit; the controlling a power supply of the drive IC to power up according to a set rule after receiving a start signal includes:

controlling a power supply voltage of the power management circuit to power up according to the set rule after receiving the start signal for reducing the probability that the gate driving negative voltage outputted by the drive IC is abnormally raised.

In one of the embodiments, the controlling a power supply voltage of the power management circuit to power up according to the set rule after receiving the start signal includes:

controlling the power supply voltage of the power management circuit to normally power up to a first level after receiving the start signal;

controlling the power supply voltage of the power management circuit to reduce to a second level after a first time period, the second level is lower than the first level; and controlling the power supply voltage of the power management circuit to rise again to the first level after a second time period.

In one of the embodiments, the first level sustains between 2.5V and 4.8V; preferably, the first time period sustains between 8 ms and 12 ms; preferably, the first time period sustains about 10 ms;

In one of the embodiments, the second level sustains between 1 V and 2.2 V.

In one of the embodiments, the drive IC includes a power management circuit and a digital circuit; and the controlling a power supply of the drive IC to power up according to a set rule after receiving a start signal includes:

controlling a power supply voltage of the power management circuit to power up after receiving the start signal; and controlling a power supply voltage of the digital circuit to power up after a third time period; preferably, the third time period sustains between 90 ms and 110 ms; preferably, the third time period sustains about 100 ms.

In one of the embodiments, the controlling a power supply voltage of the digital circuit to power up after a third time period includes:

controlling the power supply voltage of the digital circuit to power up after the power supply voltage of the power management circuit is stepped down in the drive IC;

Preferably, the controlling of the power supply voltage of the digital circuit to power up after the power supply voltage of the power management circuit is stepped down in the drive IC includes: reducing a power supply voltage of the power management circuit to a first voltage and then reducing the first voltage to a second voltage in the drive IC, then controlling the power supply voltage of the digital circuit to power up; the second voltage is a reference voltage used by the power management circuit; preferably, the first voltage is a voltage produced by a charge pump in the power management circuit.

A control device of display power supply, applied to a thin film transistor display screen; the thin film transistor display screen includes a drive IC and a screen body; the drive IC is configured to control the screen body to display a corresponding image, and the screen body uses a thin film transistor to control a pixel;

the control device includes:

a power-up control circuit controlling a power supply of the drive IC to power up according to a set rule after receiving a start signal for reducing a probability of abnormality in a voltage outputted by the drive IC; and a normal power supply suppling power continuously and normally to the drive IC.

A storage medium, applied to a thin film transistor display screen; the thin film transistor display screen includes a power IC, a drive IC, and a screen body; the storage medium is located in the power IC and stores a program, the program is executed by a processor in the power IC to perform:

controlling a power supply of the drive IC to power up according to a set rule after receiving a start signal for reducing a probability of abnormality in a voltage outputted by the drive IC; and supplying power continuously and normally to the drive IC.

An electronic device includes a power IC, a drive IC, and a screen body; the power IC includes a memory in which a program is stored, when the program is executed by the processor, causing the processor to perform:

controlling a power supply of the drive IC to power up according to a set rule after receiving a start signal for reducing a probability of abnormality in a voltage outputted by the drive IC; and supplying power continuously and normally to the drive IC.

According to the control method and control device of display power supply, the storage medium, and the electronic device, after receiving the start signal, the power supply of the drive IC is powered up according to the set rule to reduce the probability of abnormality in a voltage outputted by the drive IC. Since the power supply of the drive IC directly determines the performance of the voltage output from the drive IC to the screen body, and fluctuations happen when the power supply is powered up, the quality of the output signal of the drive IC can be improved by improving the power-up condition of the power supply of the drive IC, thereby reducing the probability of black screen on the screen body and improving the display performance of the display screen.

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION OF THE INVENTION

The present disclosure are described in details in combination with the accompanying drawings and embodiments such that the purpose, technical solution and advantages of the present disclosure will be more apparent. It should be understood that the particular embodiments are described for the purpose of illustrating as opposed to restricting the present disclosure.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the present invention provide a control method of display power supply, which is applied to a thin film transistor display screen. The thin film transistor display screen includes a power IC, a drive IC and a screen body. The screen body controls the pixel with the thin film transistor. The screen body includes, for example, a pixel matrix, a row drive circuit, and a column drive circuit. The pixel matrix includes a plurality of pixels and a plurality of pixel drive circuits, each pixel is controlled by one pixel drive circuit. The row drive circuit sends a scan signal to each pixel drive circuit through a row (scan) address bus. The column drive circuit sends a data signal to each pixel drive circuit through a column (data) address bus. The drive IC is configured to control the screen body to display the corresponding image. The drive IC is electrically connected with the row drive circuit and the column drive circuit respectively, and is responsible for data processing, transmission, issuing of control signal and other functions of the entire display screen. The drive IC is composed of, for example, a single chip microcomputer (or FPGA) and peripheral circuits. A power IC is configured to supply power to the drive IC. The control method of display power supply provided in this embodiment may be performed by a power IC.

Figure 1:
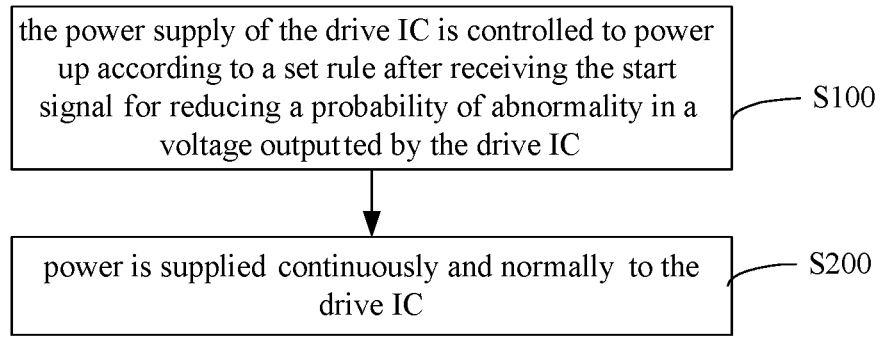
FIG. 1 is a flowchart of a control method of display power supply according to an embodiment.

Referring to FIG. 1, the control method of display power supply provided in this embodiment includes the following steps.

In step S100, the power supply of the drive IC is controlled to power up according to a set rule after receiving the start signal for reducing a probability of abnormality in a voltage outputted by the drive IC.

The start signal is, for example, a signal produced after a power-up or sleep wake-up. The power supply of the drive IC refers to a power supply input from the power IC to the drive IC. The voltage outputted by the drive IC includes, for example, a gate driving positive voltage VGH and a gate driving negative voltage VGL. After the output voltage of the drive IC is abnormal, the operation of the thin film transistor of the screen body will be abnormal, and thus a black screen of the screen body will happen.

The drive IC includes, for example, digital circuits and analog circuits, as described below.

The digital circuit includes, for example, an input/output port and a timing control module (i.e., a TCON module). The input/output port has high-speed parallel bus port and serial peripheral port (SPI) port. For example, the timing control module performs the functions of data processing in the SPI port and the RGB port and timing control of some modules in the drive IC.

The analog circuit includes, for example, a power management module or can be called as power management circuit, and a pixel drive module. The power management circuit provides a voltage for scan signals of parts of the drive chip and the display screen. The power management circuit includes, for example, a reference voltage source, a charge pump, a low dropout regulator (LDO). The pixel drive module includes, for example, a source drive module, a gate drive module, and a gamma correction module. The source drive module outputs gray scale voltage to the column drive circuit in the screen body. The gate drive module outputs a scan signal (for example, including a gate driving positive voltage VGH and a gate driving negative voltage VGL) to the row drive circuit. The gamma correction module is configured to provide the gray scale voltage to the source drive module, and the change of the corresponding relationship between the binary code and the gray scale voltage can be realized by adjusting the gamma curve.

In the drive IC, the power supply of the drive IC includes, for example, the power supply voltage VCI of the power management circuit and the power supply voltage of the digital circuit. Since the voltage output from the drive IC is abnormally fluctuated due to a fluctuation situation likely to happen at the power-up of the power supply, an abnormal fluctuation of the voltage outputted by the drive IC may happen, thereby resulting in a black screen on the display screen. Accordingly, the probability of a black screen on the screen body can be reduced to some extent by way of improving the power up mode of the power supply of the drive IC.

In step S200, power is supplied continuously and normally to the drive IC.

After the step S100 is performed, the power IC supplies power to the drive IC according to the normal requirements, so that the thin film transistor display screen operates normally.

In summary, in the control method of display power supply provided in the above embodiment, since the power supply of the drive IC directly determines the performance of the voltage output from the drive IC to the screen body, and fluctuations happen when the power supply is powered up, therefore, the quality of the output signal of the drive IC can be improved by improving the power-up condition of the power supply of the drive IC, thereby reducing the probability of black screen on the screen body and improving the display performance of the display screen.

In an embodiment, the drive IC includes a power management circuit. And step S100 is: a power supply voltage of the power management circuit is controlled to power up according to the set rule after the start signal is received, to reduce the probability that the gate driving negative voltage VGL outputted by the drive IC is abnormally raised.

The gate driving negative voltage VGL is obtained by reducing the power supply voltage VCI of the power management circuit. The abnormal rise of the gate driving negative voltage VGL refers to a case where the gate driving negative voltage VGL is higher than the normal voltage range, for example, in a normal case, the range of the gate driving negative voltage VGL is (−7V, 0V), when the gate driving negative voltage VGL rises to 0.6 V, it is considered to be abnormally raised.

In the conventional thin film transistor display screen, immediately after the power supply voltage VCI of the power management circuit is powered up, there may be a case where the voltage fluctuation exceeds the normal range, causing the gate driving negative voltage VGL to be abnormally raised. At this time, a Latch-up phenomenon (i.e., the voltage output from the drive IC is abnormally high, resulting in abnormal operation of the thin film transistor) would happen in the drive IC. Since the gate driving negative voltage VGL directly controls the operation of the thin film transistor, an abnormality of the voltage may cause the thin film transistor to fail to turn on, thereby causing a black screen. In the present embodiment, by improving the power-up condition of the power supply voltage VCI of the power management circuit, for example, reducing the ripple current to reduce the amplitude of the gate driving negative voltage VGL, thereby reducing the probability that the gate driving negative voltage VGL is abnormally high.

Figure 2:
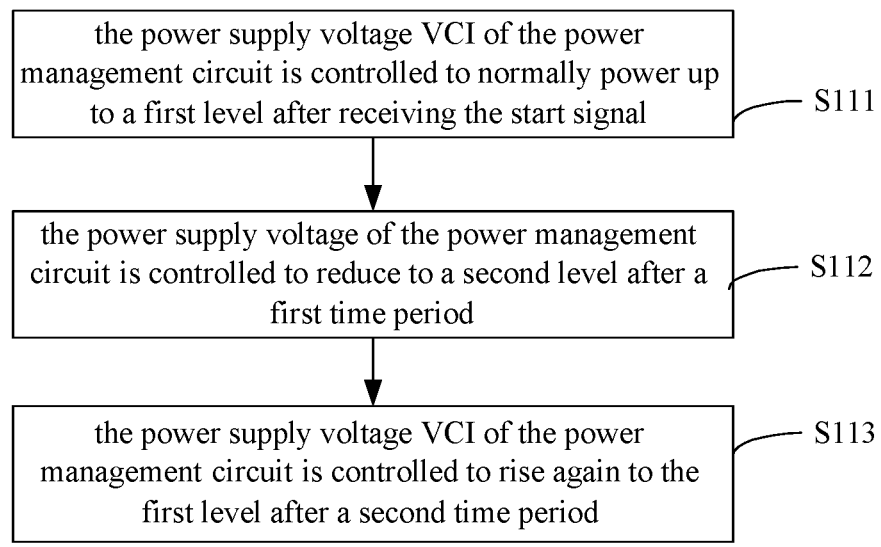
FIG. 2 is a flowchart according to an embodiment of step S100 of the control method of display power supply of the embodiment in FIG. 1.

Specifically, the specific implementation of step S100 may include the following steps, referring to FIG. 2.

In step S111, the power supply voltage VCI of the power management circuit is controlled to normally power up to a first level after receiving the start signal.

The first level may be a normal power supply voltage of the power management circuit, for example, between 2.5V and 4.8V. Optionally, the first level is 3.3V.

In step S112, the power supply voltage of the power management circuit is controlled to reduce to a second level after a first time period; and the second level is lower than the first level.

The first time period is related to a transient response characteristic of the power IC. The shorter the time of the transient response, the longer the first time period. Preferably, the first time period sustains between 8 ms and 12 ms, such as about 10 ms. The magnitude of the second level at least ensures that the magnitude of the gate driving negative voltage VGL does not cause a black screen problem on the screen body. The second level is, for example, between 1 V and 2.2 V. Alternatively, the second level is, for example, 1.8 V, when the corresponding gate driving negative voltage VGL is less than 0.4 V.

Specifically, the power IC may reduce the first level by a charge pump or other circuits capable of reducing voltage to produce a second level to provide the second level to the power management circuit in step S112.

In step S113, the power supply voltage VCI of the power management circuit is controlled to rise again to the first level after a second time period.

The second time period is related to the transient response characteristic of the power IC. The shorter the time of the transient response, the longer the second time period. Preferably, the second time period sustains between 8 ms and 12 ms, such as about 10 ms.

Specifically, the power IC may also boost the second level to the first level again using a charge pump or other circuits capable of reducing voltage, and provide the first level to the power management circuit in step S113.

In the above specific implementation shown in FIG. 2, after the power supply voltage VCI of the power management circuit is normally powered up, the power supply voltage is further stepped down, so that the latch up current can be reduced so that the gate driving negative voltage VGL is caused to reduce, until the power supply voltage VCI of the power management circuit is reduced to the second level, the latch up phenomenon can be released, and then the power supply voltage VCI of the power management circuit is again raised to the first level, i.e., allowing the drive IC to operate normally.

Therefore, by optimizing the power-up mode (i.e., by way of a high level to low level to high level) of the power supply voltage VCI of the power management circuit, the described specific implementation can reduce the probability of a black screen on the screen body.

In another embodiment, the step S100 may use another way to reduce the probability that the voltage output from the drive IC is abnormal. The drive IC includes the power management circuit and the digital circuit. The above step S100 specifically includes the following steps, referring to FIG. 3.

In step S121, after receiving the start signal, the power supply voltage VCI of the power management circuit is controlled to be powered up.

In step S122, the power-up of the power supply voltage of the digital circuit is controlled after the third time period.

In this embodiment, the power-up sequence of the power supply voltage VCI of the power management circuit and the power supply voltage of the digital circuit is adjusted, that is, the power supply voltage VCI of the power management circuit is first controlled to power up. After a third time period, by controlling the power supply voltage of the digital circuit to power up, the digital circuit can be protected from interference (e.g., electromagnetic interference) by VCI-related circuits, such as buck-boost circuits in the power management circuit, thereby ensuring that the digital circuit can function properly. Since the digital circuit is the core control circuit of the drive IC, the reliability of the drive IC can be improved, the probability of voltage output from the drive IC is reduced, and the probability of black screen on the display screen is reduced. Specifically, the third time period sustains between 90 ms and 110 ms, for example, about 100 ms.

Specifically, the power supply voltage of the digital circuit is, for example, the voltage VDDIO of the input/output port. The power supply voltage DVDD of the timing control module is obtained by reducing the voltage VDDIO of the input/output port. At this time, the voltage VDDIO of the input/output port is controlled and then powered up, and when there is no interference, the power supply voltage of the timing control module can be ensured to be less than the set voltage threshold (for example, 1.4 V), so that the timing control module can operate normally.

Specifically, in step S122, after the power supply voltage VCI of the power management circuit is stepped down in the drive IC, the power supply voltage of the digital circuit is controlled to power up.

To step down the power supply voltage VCI of the power management circuit means that the power supply voltage VCI of the power management circuit is sequentially and gradually reduced to one or more voltages. And, the power supply voltage of the data circuit is controlled to power up when the time of the entire voltage reducing process of the power supply voltage VCI of the power management circuit reached the third time period. Specifically, the voltage reducing process of the power supply voltage of the power management circuit may be implemented by a charge pump or other circuit that may implement the reduction.

Specifically, the step of after the power supply voltage VCI of the power management circuit is stepped down in the drive IC, the power supply voltage of the digital circuit is controlled to power up is: the power supply voltage VCI of the power management circuit is reduced to a first voltage in the drive IC, and then the first voltage is reduced to a second voltage, and then the power supply voltage of the digital circuit is controlled to power up. The second voltage is, for example, a reference voltage VREF used by the power management circuit.

The power supply voltage VCI of the power management circuit is reduced to a first voltage, and the first voltage is further reduced to a second voltage. The total time of the process is the third time period. For example: the power supply voltage VCI of the power management circuit may be controlled to decrease to the first voltage by adjusting the rising edge, the falling edge duration of the charge pump in the drive IC, or by adjusting the number of instructions commonly executed by the timing control module, then, the first voltage is reduced to the second voltage, and the total time of the process is the third time period.

Specifically, the first voltage is VCL, i.e., a voltage produced by the charge pump in the power management circuit. Alternatively, the power supply voltage VCI of the power management circuit may be reduced to a first voltage by a charge pump and then reduced to a second voltage by the first voltage.

Figure 3:
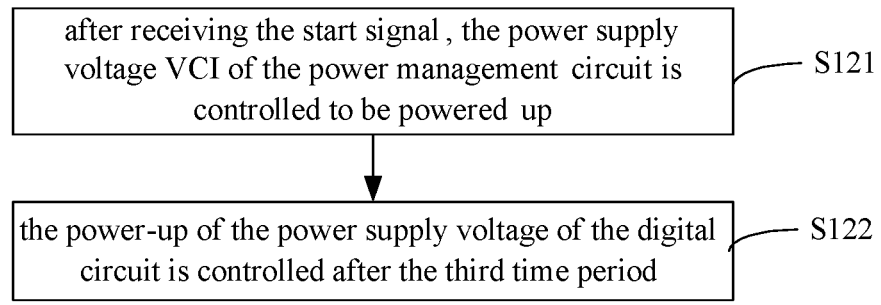
FIG. 3 is a flowchart according to another embodiment of step S100 of the control method of display power supply of the embodiment in FIG. 1.
Figure 4:
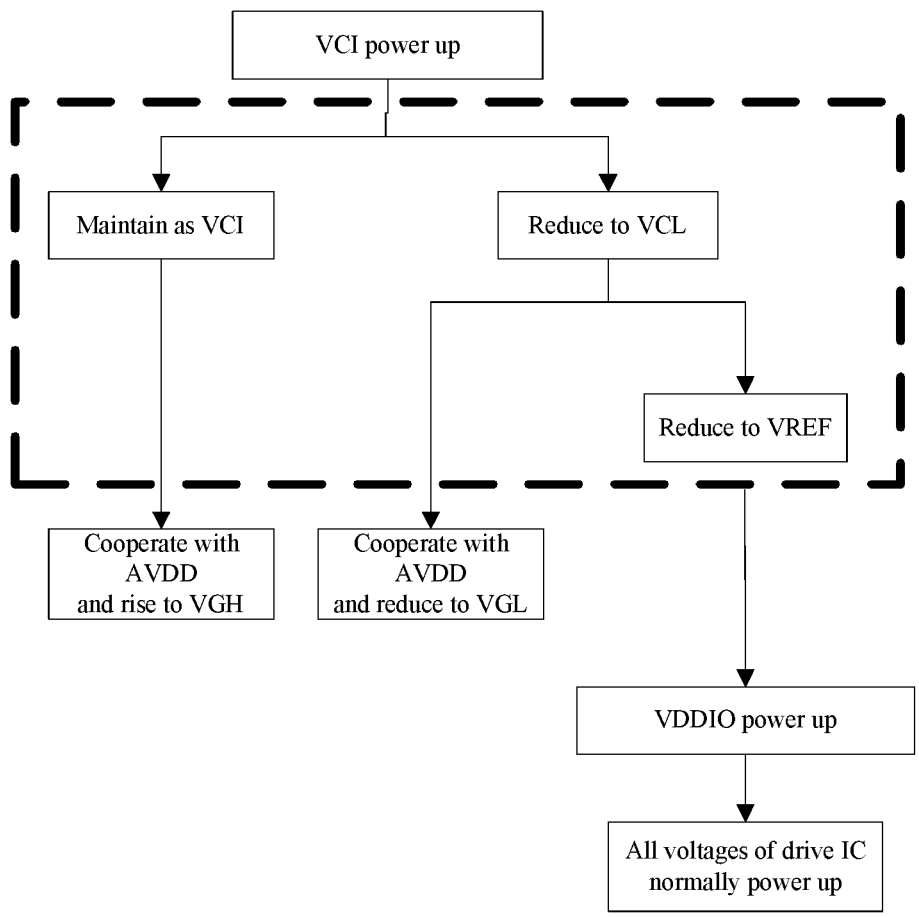
FIG. 4 is a flowchart of a specific power-up mode of the drive IC in the control method of display power supply of the embodiment in FIG. 3.

Furthermore, based on the embodiment shown in FIG. 3, referring to FIG. 4 for the power-up of each voltage in the drive IC. After the power supply voltage VCI of the power management circuit is powered up, for one thing, the power supply voltage VCI of the power management circuit maintains its own voltage magnitude, and cooperates with the voltage AVDD (i.e., the power supply voltage of the buck-boost circuit in the gamma correction module and the power management circuit) to produce the gate drive positive voltage VGH through the charge pump or other circuits that capable of reducing voltage. The magnitude of VGH is, for example, AVDD+VCI, 2AVDD, 2AVDD+VCI, or 3AVDD. For another thing, the power supply voltage VCI of the power management circuit may be reduced by a charge pump or other circuits capable of reducing voltage to the first voltage VCL. The process in which the power supply voltage VCI of the power management circuit maintains its own voltage magnitude is performed simultaneously with the process in which the power supply voltage VCI of the power management circuit is lowered to the first voltage VCL. After the power supply voltage VCL of the power management circuit is reduced to the first voltage VCL. For one thing, the first voltage VCL may be reduced in cooperation with the voltage AVDD to produce the gate driving negative voltage VGL, for another thing, the first voltage VCL is further reduced to obtain a second voltage (e.g., the VREF as described). In FIG. 4, the total time of the process from the VCI power-up to reducing to VREF within the dashed box is the described the third time period. After falling to VREF (i.e., after the third time period), the power supply voltage of the digital circuit is powered up.

It should be noted that FIGS. 1 to 3 are flowcharts of the methods according to the embodiments of the disclosure. It should be understood that although the steps in the flowcharts of FIGS. 1 to 3 are sequentially displayed as indicated by arrows, these steps are not necessarily sequentially performed as indicated by arrows. Unless explicitly stated herein, the execution of these steps is not strictly sequential, and the steps may be performed in other sequences. Moreover, at least a part of the steps in FIGS. 1 to 3 may include a plurality of sub-steps or stages that are not necessarily performed at the same time, but may be performed at different times, and the order of execution of the sub-steps or stages is not necessarily performed sequentially, but may be performed in turn or alternately with at least a part of other steps or sub-steps or stages of other steps.

Figure 5:
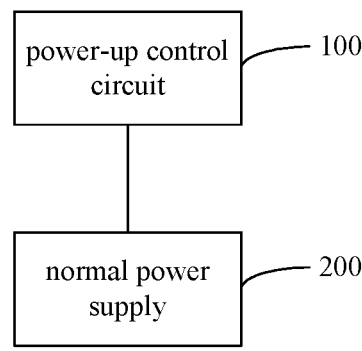
FIG. 5 is a block diagram of a control device of display power supply according to another embodiment.

Another embodiment provides a control device of display power supply, which is applied to a thin film transistor display screen. The thin film transistor display screen includes a drive IC and a screen body. The drive IC is configured to control the screen body to display a corresponding image, and the screen body uses the thin film transistor to control a pixel. The control device of display power supply includes the following components, referring to FIG. 5.

A power-up control module 100, or can be called into power-up control circuit, configured to control a power supply of the drive IC to power up according to a set rule after receiving a start signal for reducing a probability of abnormality in a voltage outputted by the drive IC.

A normal power supply module 200, or can be called into normal power supply 200, configured to supply power continuously and normally to the drive IC.

In an embodiment, the drive IC includes a power management circuit. The power-up control circuit 100 is configured to control a power supply of the drive IC to power up according to a set rule after receiving a start signal for reducing a probability of abnormality in a voltage outputted by the drive IC.

Figure 6:
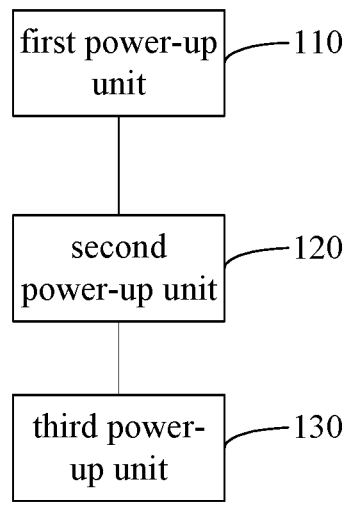
FIG. 6 is a block diagram according to an embodiment of a power-up control circuit of the control device of display power supply of the embodiment shown in FIG. 5.

In an embodiment, the power-up control circuit 100 includes the following components, referring to FIG. 6:

A first power-up unit 110 is configured to control the power supply voltage of the power management circuit to normally power up to the first level after receiving the start signal.

A second power-up unit 120 is configured to control the power supply voltage of the power management circuit to reduce to a second level after a first time period. The second level is lower than the first level.

A third power-up unit 130 is configured to control the power supply voltage of the power management circuit to rise again to the first level after a second time period.

In an embodiment, the first level sustains between 2.5V and 4.8V. Preferably, the first time period sustains between 8 ms and 12 ms. Preferably, the first time period sustains about 10 ms. Preferably, the second time period sustains between 8 ms and 12 ms. Preferably, the second time period sustains about 10 ms, in an embodiment, the second level sustains between 1 V and 2.2 V.

Figure 7:
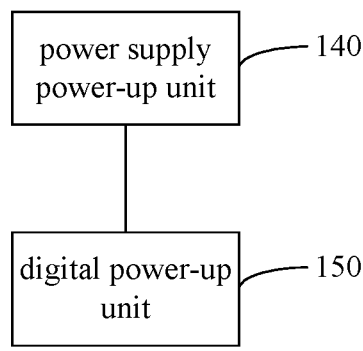
FIG. 7 is a block diagram according to another embodiment of a power-up control circuit of the control device of display power supply of the embodiment shown in FIG. 5.

In an embodiment, that drive IC includes a power management circuit and a digital circuit. Also, the power-up control circuit 100 includes the following, referring to FIG. 7:

A power supply power-up unit 140, configured to control a power supply voltage of the power management circuit to power up after receiving the start signal.

A digital power-up unit 150, configured to control a power supply voltage of the digital circuit to power up after a third time period. The third time period sustains between 90 ms and 110 ms. Preferably, the third time period sustains about 100 ms.

In an embodiment, the digital power-up unit 150 is configured to control the the digital circuit to power up after the power supply voltage of the power management circuit is stepped down in the drive IC. Preferably, the digital power-up unit 150 is configured to control the power supply voltage of the data circuit to power up after the power supply voltage of the power management circuit is reduced to a first voltage within the drive IC, and the first voltage is further reduced to a second voltage. The second voltage is a reference voltage used by the power management circuit. Preferably, the first voltage is a voltage produced by a charge pump in the power management circuit.

It should be noted that the control device of display power supply provided in this embodiment corresponds to the control method of display power supply of the foregoing embodiment and is omitted for brevity.

Another embodiment provides a storage medium. The storage medium may be a disk, an optical disk, a read-only memory (ROM), or the like. The storage medium is applied to a thin film transistor display screen. The thin film transistor display screen includes a power IC, a drive IC and a screen body. The storage medium is located in the power IC, and the storage medium stores a program which, when executed by a processor in the power IC, implements the following steps:

Controlling a power supply of the drive IC to power up according to a set rule after receiving a start signal for reducing a probability of abnormality in a voltage outputted by the drive IC; and Supplying power continuously and normally to the drive IC.

It should be noted that the steps executed by the processor in this embodiment correspond to the control method of the display power supply according to the foregoing embodiment and is omitted for brevity.

Another embodiment provides an electronic device such as a mobile phone, a computer, etc. The electronic device includes a power IC, a drive IC, and a screen body. The power IC includes a memory and a processor, the memory has a program stored thereon which, when executed by the processor, causes the processor to perform the following steps:

Controlling a power supply of the drive IC to power up according to a set rule after receiving a start signal for reducing a probability of abnormality in a voltage outputted by the drive IC; and Supplying power continuously and normally to the drive IC.

It should be noted that the steps executed by the processor in this embodiment correspond to the control method of the display power supply according to the foregoing embodiment and is omitted for brevity.

The foregoing respective technical features involved in the respective embodiments can be combined arbitrarily, for brevity, not all possible combinations of the respective technical features in the foregoing embodiments are described, however, to the extent they have no collision with each other, the combination of the respective technical features shall be considered to be within the scope of the description.

The foregoing implementations are merely specific the embodiment of the present disclosure, and are not intended to limit the protection scope of the present disclosure. It should be noted that any variation or replacement readily figured out by persons skilled in the art within the technical scope disclosed in the present disclosure shall all fall into the protection scope of the present disclosure. Therefore, the protection scope of the present disclosure shall be subject to the protection scope of the claims.

The invention claimed is:

1. A control method of display power supply, applied to a thin film transistor display screen comprising a drive IC and a screen body, the drive IC comprising a power management circuit, the drive IC controlling the screen body to display a corresponding image, and the screen body controlling a pixel via a thin film transistor;

the control method comprising:
controlling a power supply of the drive IC to power up according to a set rule after receiving a start signal for reducing a probability of abnormality in a voltage outputted by the drive IC, comprising:
controlling a power supply voltage of the power management circuit to power up according to the set rule after receiving the start signal for reducing the probability that a gate driving negative voltage outputted by the drive IC is abnormally raised, comprising:
controlling the power supply voltage of the power management circuit to normally power up to a first level after receiving the start signal;

controlling the power supply voltage of the power management circuit to reduce to a second level after a first time period, the second level being lower than the first level; and controlling the power supply voltage of the power management circuit to rise again to the first level after a second time period; and supplying power continuously and normally to the drive IC.

2. The control method according to claim 1, wherein the first level sustains between 2.5 V and 4.8 V.

3. The control method according to claim 2, wherein the first time period sustains between 8 ms and 12 ms.

4. The control method according to claim 2, wherein the first time period sustains about 10 ms.

5. The control method according to claim 1, wherein the second level sustains between 1 V and 2.2 V.

6. The control method according to claim 1, wherein the drive IC comprises the power management circuit and a digital circuit, and the controlling a power supply of the drive IC to power up according to a set rule after receiving a start signal comprises:

controlling the power supply voltage of the power management circuit to power up after receiving the start signal; and controlling a power supply voltage of the digital circuit to power up after a third time period.

7. The control method according to claim 6, wherein the third time period sustains between 90 ms and 110 ms.

8. The control method according to claim 6, wherein the third time period sustains about 100 ms.

9. The control method according to claim 6, wherein the controlling a power supply voltage of the digital circuit to power up after a third time period comprises:

controlling the power supply voltage of the digital circuit to power up after the power supply voltage of the power management circuit is stepped down in the drive IC.

10. The control method according to claim 6, wherein the controlling of the power supply voltage of the digital circuit to power up after the power supply voltage of the power management circuit is stepped down in the drive IC comprises: reducing a power supply voltage of the power management circuit to a first voltage and then reducing the first voltage to a second voltage in the drive IC, then controlling the power supply voltage of the digital circuit to power up, the second voltage is a reference voltage used by the power management circuit.

11. The control method according to claim 10, wherein the first voltage is a voltage produced by a charge pump in the power management circuit.

12. A control device of display power supply, applied to a thin film transistor display screen comprising a drive IC and a screen body, the drive IC controlling the screen body to display a corresponding image, and the screen body controlling a pixel via a thin film transistor;

the control device comprising:

a power-up control circuit controlling a power supply of the drive IC to power up according to a set rule after receiving a start signal for reducing a probability of abnormality in a voltage outputted by the drive IC; and a normal power supply supplying power continuously and normally to the drive IC;

wherein the drive IC comprises a power management circuit and a digital circuit, after the power supply voltage of the power management circuit is stepped down, the power supply voltage of the digital circuit is powered up.

13. An electronic device, comprising a power IC, a drive IC comprising a power management circuit and a digital circuit, and a screen body; the power IC comprising a memory in which a program being stored, wherein when the program is executed by the processor, causing the processor to perform:

controlling a power supply of the drive IC to power up according to a set rule after receiving a start signal for reducing a probability of abnormality in a voltage outputted by the drive IC, comprising:

controlling a power supply voltage of the power management circuit to power up after receiving the start signal; and controlling a power supply voltage of the digital circuit to power up after a third time period; and supplying power continuously and normally to the drive IC.

14. The electronic device according to claim 13, wherein the third time period sustains between 90 ms and 110 ms.

15. The electronic device according to claim 13, wherein the third time period sustains about 100 ms.

16. The electronic device according to claim 13, wherein controlling a power supply voltage of the digital circuit to power up after a third time period comprises:

controlling the power supply voltage of the digital circuit to power up after the power supply voltage of the power management circuit is stepped down in the drive IC.

* * * * *